(12) United States Patent
Shyu et al.

(10) Patent No.: US 7,616,769 B1
(45) Date of Patent: Nov. 10, 2009

(54) VARIABLE AND SHIFTABLE ACOUSTIC OUTPUT SIGNAL LIMITER

(75) Inventors: Ching Shyu, San Jose, CA (US); Robert M. Khamashta, Los Gatos, CA (US); Robert J. Bernardi, Scotts Valley, CA (US)

(73) Assignee: Plantronics, Inc., Santa Cruz, CA (US)

( * ) Notice: Subject to any disclaimer, the term of this patent is extended or adjusted under 35 U.S.C. 154(b) by 974 days.

(21) Appl. No.: 10/952,662

(22) Filed: Sep. 29, 2004

(51) Int. Cl.
*A61F 11/06* (2006.01)
*H04R 1/10* (2006.01)

(52) U.S. Cl. .......................................... 381/72; 381/74
(58) Field of Classification Search .................. 381/72, 381/55, 74, 104, 106, 107; 379/390.01–390.04, 379/395
See application file for complete search history.

(56) References Cited

U.S. PATENT DOCUMENTS 6,442,279 B1 * 8/2002 Preves et al. .................. 381/55

* cited by examiner

*Primary Examiner*—Ping Lee
(74) *Attorney, Agent, or Firm*—Intellectual Property Law Office of Thomas Chuang

(57) ABSTRACT

Systems and methods for variably and/or shiftably limiting signal output are disclosed. The system may include an attenuation circuit having an attenuation network activated by a source signal crossing a threshold to attenuate the source signal and a resistive element such as resistors bridging between the attenuation circuit input and output for variably attenuating the source signal. The attenuation circuit may be activated by a switch such as transistors. To shift the limiting threshold, the system may include a circuit to shift the activating threshold, the circuit having a control voltage source such as DC voltage source coupled to the attenuation network. The threshold shifting circuit may be configured to selectively increase the threshold during music listening and to be inactive during voice applications. The system may be incorporated in a headset adapter or a headset receiver.

9 Claims, 5 Drawing Sheets

VARIABLE AND SHIFTABLE ACOUSTIC OUTPUT SIGNAL LIMITER

BACKGROUND OF THE INVENTION

1. Field of the Invention

The present invention relates generally to acoustic signal level detection and control. More specifically, systems and methods for detecting and variably and/or shiftably limiting the acoustic signal output level are disclosed.

2. Description of Related Art

Proper control of acoustic signal levels in communications and other audio output devices is desirable to ensure high quality audio output and hearing safety to the users. For example, a telephone headset provides a speaker contained within an earpiece positioned over the user's ear. To ensure acoustic safety and high acoustic quality, the sound level of the acoustic signal emitted by the speaker should fall within a specified sound intensity range. Below the specified intensity range, the inadequate sound level may not be sufficient for the user to hear or understand what is being uttered by the remote talker. On the other hand, above the specified intensity range, the excessive sound level may cause discomfort for the user and/or injury to the user's hearing. Thus excessively high sound levels are of particular concern in communication and other audio devices such as telephone handsets and headsets and other listening devices that position a speaker near the user's ear.

Excessively high sound levels may be caused by various events. For example, accidental disturbances within a communication connection, such as a amplifier malfunction, intense feedback, incorrect signal source, and/or a phone line shorted to a power line, may cause dramatic increases in the electrical signal level input to a transducer that converts electrical signals to acoustic signals. The transient time for the acoustic signal to reach excessively high levels may be very short such that a user often does not have sufficient time to move the listening device away from the ear in time to prevent exposure to the high sound levels. Although a handset user may be able to quickly move the handset speaker away from the ear as the user is typically already holding the handset in the hand, it may take a hands-free headset user longer to bring the hand to the headset in order to move the headset earpiece away from the ear. Furthermore, headsets are particularly suitable for users who are on the telephone for long periods of time, e.g., telemarketers, receptionists, and operators. Thus because of the extra time required to remove a headset away from the ear and the potentially longer periods of headset usage, headset users may be particularly vulnerable to exposure to excessively high sound levels caused by sudden or constant loud audible signals.

Headsets and other audio output devices often employ audio limiting devices on the receiver input terminals in order to limit the voltage and thus the maximum sound level from the headset receiver. Examples of audio limiting devices include a pair of diodes in shunt arranged in opposing polarity (as shown and described below with reference to FIG. 1) and an acoustic limiting component utilizing transistors (as shown and described below with reference to FIG. 2).

In particular, FIG. 1 is a circuit diagram illustrating an exemplary signal circuit 20 employing a conventional varistor circuit 22 for reducing the maximum signal level to the receiver and thus the sound exposure to the user. The varistor circuit 22 is essentially a surge protector that creates a shunt path using diodes to attenuate signal peaks. As shown, a voltage source $V_s$ 24 with a corresponding source impedance $R_s$ 26 provides an electrical signal to an attached load $R_L$ 28 via the varistor circuit 22. The voltage source 24 may be, for example, a telephone or telephone adapter and the attached load 28 may be a receiver such as a telephone headset or handset speaker.

The varistor circuit 22 includes a first diode $D_1$ 30 in parallel to a second diode $D_2$ 32, each having a corresponding turn-on voltage, e.g., 0.5 to 0.7 volts, to activate the corresponding diode. Each diode 30, 32 shunts the respective positive or negative portion of an electrical signal through its corresponding path after the respective diode turn-on voltage is reached by the electrical signal received from the voltage source 24. In particular, the first diode 30 is activated to shunt the negative portion of the electrical signal current when the magnitude of the negative portion of the electrical signal current exceeds the first diode's turn-on voltage. In other words, when the magnitude of the negative portion of the electrical signal current is below the turn-on voltage, the first diode 30 remains cut off. However, when the magnitude of the negative portion of the electrical signal current is above the turn-on voltage, the first diode 30 turns on to conduct current from the voltage source 24, thereby creating a shunt path. The specific amount of current conducted through the shunt path depends on the impedance of the load 28. As a result of the activated negative shunt path, the level of the negative portion of the electrical signal current received by the load 28 is reduced such that the output voltage $V_{out}$ 34, i.e., the relative voltage across the load 28, is similarly reduced.

The second diode 32 operates in a similar manner as the first diode 30 except that it creates a shunt path for the positive portion of the electrical signal received form the voltage source 24. As a result of the positive and negative diode shunt paths, the magnitude of each positive and negative portion of the electrical signal and the output voltage $V_{out}$ 34 are attenuated when the diodes 30, 32 are turned on.

FIG. 2 is a circuit diagram illustrating another exemplary signal circuit 40 employing a discrete transistor circuit 42 in parallel with a varistor circuit 22 for reducing electrical signal peaks. As shown, the discrete transistor circuit 42 is in parallel with the first and second diodes 30, 32 of the varistor circuit 22. The discrete transistor circuit 42 includes a first transistor $Q_1$ 44, a second transistor $Q_2$ 46, a first resistor $R_1$ 48 and a second resistor $R_2$ 49. The base and emitter of the first transistor 44 are connected across the voltage source 24. The second transistor 46 is coupled in parallel to the voltage source 24 in a similar manner. The discrete transistor circuit 42 is placed in front of the two diodes 30, 32 and is activated by an electrical signal voltage level from the voltage source 24 being above the turn-on voltage of the first and second transistors 44, 46.

The first transistor 44 attenuates the positive portion of an electrical signal after the voltage level between the emitter and base of the first transistor 44 exceeds the turn-on voltage of the first transistor 44, e.g., approximately 0.5-0.7 volts. Once the first transistor 44 is turned on, an attenuation network is created that includes the first resistor 48 and the resistance $R_{ce1}$ between the collector and emitter of the first transistor 44. The attenuation network decreases the positive voltage at the load 28 by allowing current to flow through the first transistor 44. As the voltage level of the electrical signal from the voltage source 24 increases further above the turn-on voltage, the first transistor 44 reaches saturation mode and the resistance $R_{ce1}$ decreases. As a result, because $R_{ce1}$ forms a divider network with the first resistor 48, the current flowing through the first transistor 44 increases, thereby further limiting the relative voltage across the load 28. Thus increases in the voltage level of the voltage source 24 above the turn-on voltage of the first transistor 44 results in deepening of the saturation level within the first transistor 44 and a decrease in the resistance $R_{ce1}$ such that the voltage across the load 28 decreases.

The second transistor 46 operates in a similar manner as the first transistor 44 but on the negative portion of the electrical signal from the voltage source 24. Specifically, after the second transistor 46 is turned on, an attenuation network is created including the second resistor 49 and the resistance $R_{ce2}$ between the collector and emitter of the second transistor 46. The second transistor 46 thus operates to attenuate the negative portion of the electrical signal to limit the relative voltage across the load 28 as the negative voltage level of the voltage source 24 increases.

However, receivers often differ in receiver sensitivity and impedance. Accordingly, it would be desirable to provide an acoustic limiting device that varies the attenuation level of an audio listening device depending on the level of the received voltage. In particular, it would be desirable to provide an acoustic limiting device that provides less signal attenuation in a linear range and greater signal attenuation in the non-linear range.

In addition, headsets are becoming more commonly used for multiple applications, e.g., both speech such as in traditional telephony and music. Peak to average acoustic level ratios for music are greater than those for speech such that traditional diode limiting causes undesirable audible distortion for louder music listening applications. Limiting diodes may be selected to suit each application, e.g., voice and music. For example, diodes may be provided for the voice applications and removed and/or switched off for music applications. However, such removal and/or switching off the limiting diodes would not provide audio limiting protection for music applications. Alternatively, a switch may be provided to select diodes corresponding to the particular application thus requiring redundant diodes.

It would thus also be desirable to vary the audio limiting level depending on the application for which the headset is used, e.g., a higher audio limiting level for music applications and a lower audio limiting level for voice applications.

SUMMARY OF THE INVENTION

Systems and methods for detecting and variably and/or shiftably limiting the acoustic signal output level are disclosed. It should be appreciated that the present invention can be implemented in numerous ways, including as a process, an apparatus, a system, a device, a method. Several inventive embodiments of the present invention are described below.

The system generally includes an attenuation circuit having an attenuation network activated by a source electrical signal crossing a threshold to attenuate the source signal and a resistive element bridging between the an input and output of the signal level attenuation circuit for variably attenuating the source signal. The attenuation circuit may be activated by a switch such as transistors. The resistive element may include a first and a second resistor, the first resistor being coupled to the positive terminals of the signal source and the output and the second resistor being coupled to the negative terminals of the signal source and the output. The first and second resistors may be equal in resistance.

The signal level attenuation circuit may include a switch such as two transistors configured to activate the attenuation network in response to the level of the source electrical signal crossing the threshold. For example, a first and a second transistor may each detect a voltage on a positive or negative portion of the source electrical signal. An emitter of the first transistor may be coupled to a base of the second transistor and to a positive terminal of the signal source while an emitter of the second transistor may be coupled to a base of the first transistor and to a negative terminal of the signal source. The attenuation network may include a first and a second limiting component each having an input coupled to a collector of the first and second transistor, respectively. Outputs of the first and second limiting components may be coupled to the positive and negative terminals of the output.

To shift the limiting threshold, the system may include a threshold shifting circuit to shift the threshold for activating the signal level attenuation circuit, the threshold shifting circuit having a control voltage source such as DC voltage source coupled to the attenuation network via a resistive element for applying a control voltage to the attenuation network. The threshold shifting circuit may be configured to selectively, either manually or automatically, increase the signal level threshold when the system is employed for music listening and to be inactive when the system is employed for voice applications.

The resistive element of the threshold shifting circuit may include a first resistor coupled to an emitter of the first transistor and a second resistor coupled between the first resistor and an emitter of the second transistor, one terminal of the shift control voltage source being coupled between the first and second resistors. The threshold shifting circuit may also include a current steering circuit coupled to the shift control voltage source and coupled in parallel to the signal source. Each transistor is activated when a voltage between a base and an emitter of the transistor is above the transistor's turn-on voltage such that the shift control signal source can modify a voltage at the emitter of each transistor so as to shift the source electrical signal threshold at which the signal level attenuation circuit is activated. The resistive element of the threshold shifting circuit may also include a third resistor, e.g., with an adjustable resistance, coupled between the control voltage source and the first and second resistors.

The attenuation network may be any suitable attenuation network such as any combination of a varistor circuit, a discrete transistor circuit, a signal level attenuation circuit with a signal level relay circuit, etc. The system may be incorporated in a receiver of a personal headset or an adapter to which a personal headset can be coupled.

In another embodiment, a signal level limiting method may generally include receiving a source electrical signal from a signal source, activating an attenuation network of a signal level attenuation circuit to attenuate the source electrical signal in response to a signal level of the source electrical signal crossing a threshold, and applying a resistance bridging between an input and an output of the signal level attenuation circuit.

In yet another embodiment, a signal level limiting method may generally include activating an attenuation network of a signal level attenuation circuit to attenuate the source electrical signal in response to a signal level of the source electrical signal crossing a threshold and shifting the signal level threshold of the source electrical signal for activating the attenuation network by applying a control signal from a control signal source to the attenuation network.

These and other features and advantages of the present invention will be presented in more detail in the following detailed description and the accompanying figures which illustrate by way of example principles of the invention.

BRIEF DESCRIPTION OF THE DRAWINGS

The present invention will be readily understood by the following detailed description in conjunction with the accompanying drawings, wherein like reference numerals designate like structural elements.

DESCRIPTION OF SPECIFIC EMBODIMENTS

Systems and methods for detecting and variably and/or shiftably limiting the acoustic signal output level are disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein. For purpose of clarity, details relating to technical material that is known in the technical fields related to the invention have not been described in detail so as not to unnecessarily obscure the present invention.

Figure 3:
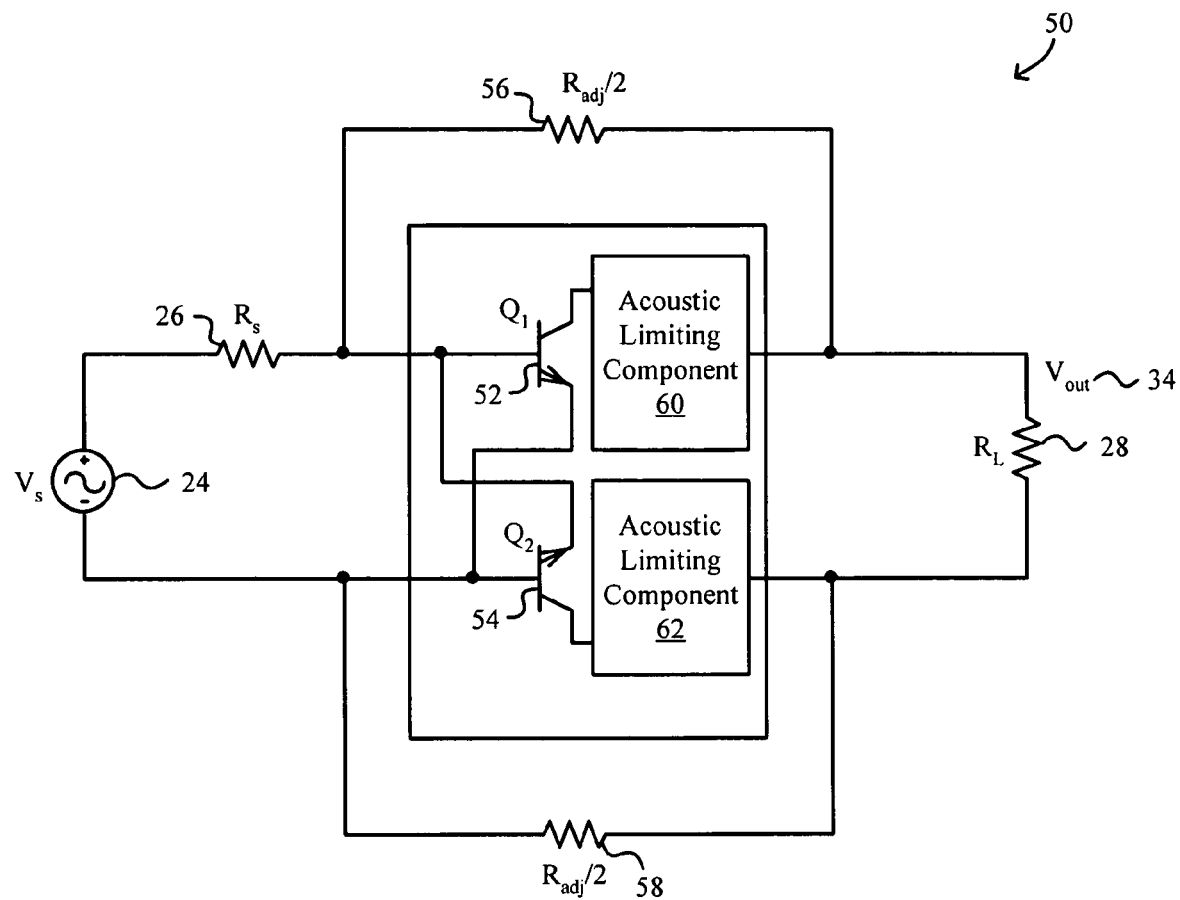
FIG. 3 is a circuit diagram of an exemplary signal circuit employing a variable limiting circuit operable to variably reduce acoustic signal output levels in various audio output devices with different coupling efficiencies.

FIG. 3 is a circuit diagram of an exemplary signal circuit 50 employing an adjustable or variable limiting circuit operable to adjustably or variably reduce acoustic signal output levels in various audio output devices, particularly personal acoustic output devices such as headset receivers. As shown, a voltage source VS 24 with a corresponding source impedance $R_s$ 26 provides an electrical signal to an attached load $R_L$ 28 via resistors and transistors. The voltage source $V_s$ 24 may be, for example, a telephone or telephone adapter and the attached load $R_L$ 28 may be an audio receiver such as a telephone headset or handset receiver/speaker.

The variably limiting signal circuit 50 is operable to provide tailoring and adjustment of the limiting characteristics of the one or more acoustic limiting components 60, 62 of the circuit 50 in order to match the overall limiting characteristics of the circuit 50 to the different coupling efficiencies of various receivers. Specifically, different types of receivers may have different coupling efficiencies such that the signal output level is preferably fine tuned to match the coupling efficiency of the corresponding receiver. Such fine tuning and matching of the overall limiting characteristics of the circuit 50 to the coupling efficiency of the receiver ensures that safety requirements are met and that acoustic output characteristics are optimized. In particular, the variably limiting signal circuit 50 operates to minimize or otherwise reduce signal loss or attenuation of the desired signal, i.e., in the non-limiting or linear range while ensuring that undesirable signals, i.e., signals in the limiting range, are appropriately attenuated to meet safety requirements.

Figure 4:
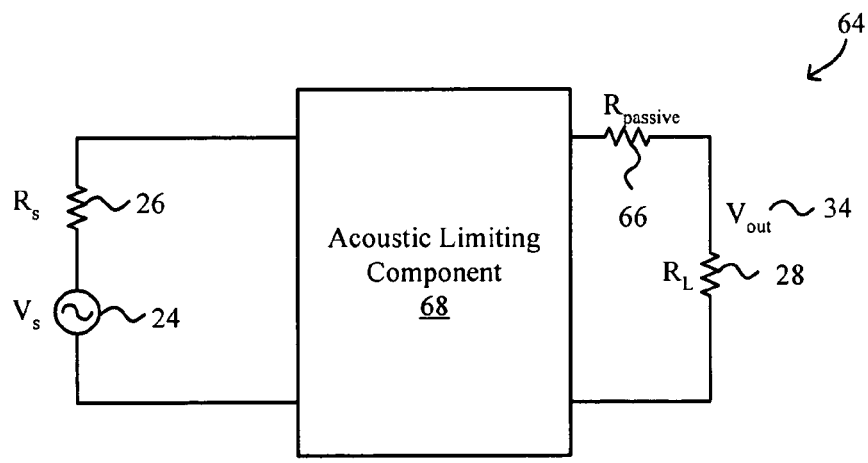
FIG. 4 is a circuit diagram of an exemplary conventional signal circuit employing a non-adjustable linear limiting circuit operable to reduce acoustic signal output levels in audio output devices.
Figure 5:
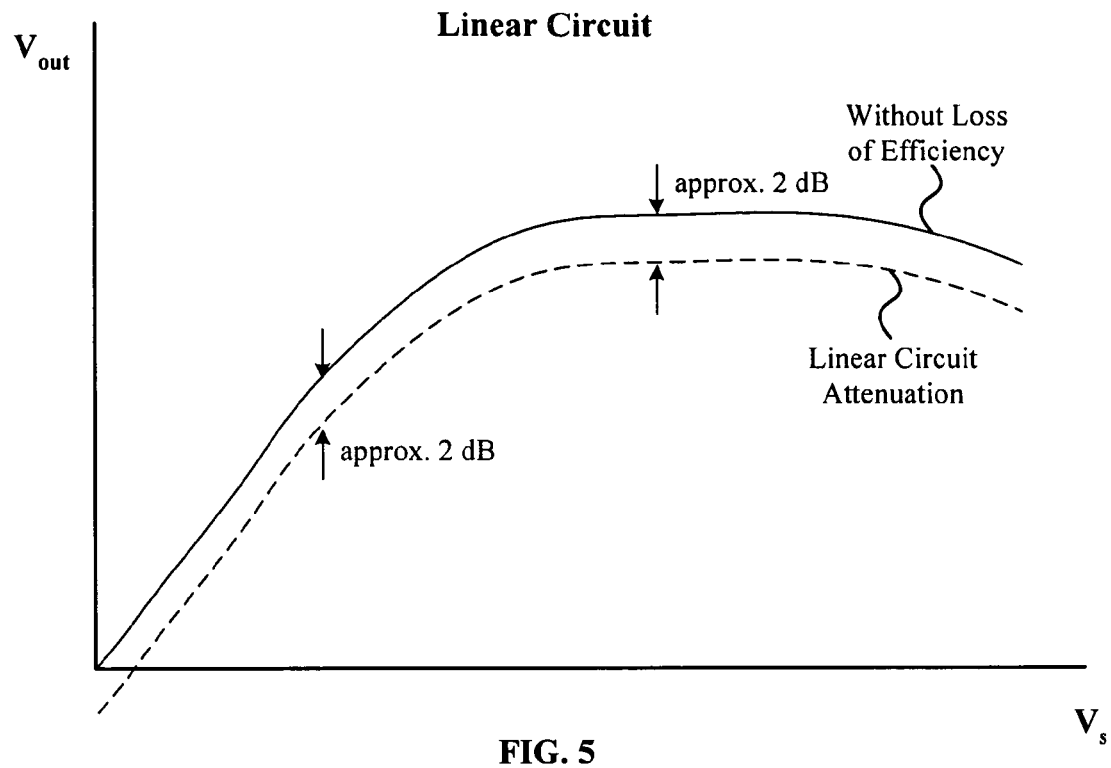
FIG. 5 is an exemplary graph illustrating the attenuation in signal level achieved by employing a conventional linear circuit such as the linear circuit of FIG. 4.

Prior to describing the variably limiting signal circuit 50 in more detail, an exemplary conventional signal circuit employing a non-adjustable linear limiting circuit for tuning the output signal level to match the coupling efficiency of the receiver is described with reference to FIGS. 4 and 5. As shown in the circuit diagram of FIG. 4, the conventional signal circuit 64 provides a passive adjusting resistor $R_{passive}$ 66 in the signal path with the acoustic limiting or protection component 68. Not taking into account the loss produced by the acoustic limiting component 68 and assuming negligible source impedance $R_s$ 26, the signal output $V_{out}$ 34 is a linear function of the signal source or input $V_s$ 24. Namely, the signal output $V_{out}$ can be expressed as:

$$V_{out} = V_s \frac{R_L}{R_L + R_{passive}} = k * V_s = f(V_s)$$

As is evident, the signal output $V_{out}$ is a linear function of the signal input $V_s$ regardless of whether the acoustic limiting component 68 is operating in a non-limiting linear region or a limiting region of the signal input/output curve. FIG. 5 is a graph illustrating the attenuation in signal level achieved by employing a conventional non-adjustable linear circuit such as the linear circuit of FIG. 4. As shown in FIG. 5, the signal output $V_{out}$ is attenuated by approximately the same amount, e.g., approximately 2 dB, in both the linear region and the limiting region.

Referring again to FIG. 3, the variably limiting signal circuit 50, in contrast, not only matches its limiting characteristics to the different coupling efficiencies of various receivers but also optimizes acoustic output characteristics by minimizing or otherwise reducing attenuation of signals in the linear, non-limiting range while appropriately attenuating signals in the non-linear, limiting range to meet safety requirements. In particular, the signal circuit 50 utilizes non-linear characteristics of a transistor saturation circuit to variably adjust $V_{out}$ relative to $V_s$. As shown, the signal circuit 50 includes a first transistor $Q_1$ 52, a second transistor $Q_2$ 54, a first resistor 56 and a second resistor 58, each $R_{adj}/2$, as well as a first acoustic limiting component 60, and a second acoustic limiting component 62.

Each resistor 56, 58 bridges between the output of the corresponding acoustic limiting component 60, 62 (i.e., the corresponding positive or negative terminal of the output voltage $V_{out}$ 34 across the load 28) and the base of the corresponding transistor 52, 54 (i.e., the corresponding positive or negative terminal of the source voltage 24). The first resistor 56 is also coupled between the positive terminals of $V_{out}$ and $V_s$ while the second resistor 58 is coupled between the negative terminals of $V_{out}$ and $V_s$. The collector of each transistor 52, 54 is coupled to the input of the corresponding acoustic limiting component 60, 62 while the emitter of each transistor 52, 54 is coupled to the negative and the positive of the voltage source 24, respectively.

Each transistor 52, 54 is activated by an electrical signal voltage level from the voltage source 24 being above the corresponding turn-on voltage of each transistor 52, 54. Specifically, the first transistor 52 attenuates the positive portion of an electrical signal after the voltage level between the base and emitter of the first transistor 52 exceeds the turn-on voltage of the first transistor 52, e.g., approximately 0.5-0.7 volts. Once the first transistor 52 is turned on, an attenuation network is created that includes the first second resistor 56 and the resistance $R_{ce1}$ between the collector and emitter of the first transistor 52. The attenuation network decreases the positive voltage at the load 28 by allowing current to flow through the first transistor 52. As the voltage level of the electrical signal increases, the first transistor 52 reaches saturation mode and the resistance $R_{ce1}$ decreases. As a result, because $R_{ce1}$ forms a divider network with the first resistor 56, the current flowing through the load 28 decreases, thereby limiting the relative voltage $V_{out}$ 34 across the load 28. As the voltage level of the voltage source 24 increases further, the saturation level within the first transistor 52 deepens to further decrease the voltage across the load 28.

The second transistor 54 operates in a similar manner as the first transistor 52 but on the negative portion of the electrical signal from the voltage source 24. Specifically, the second transistor 54 attenuates the negative portion of an electrical signal after the voltage level between the emitter and base of the second transistor 54 exceeds the turn-on voltage of the second transistor 54, e.g., approximately 0.5-0.7 volts. After the second transistor 54 is turned on, an attenuation network is created including the second resistor 58 and the resistance $R_{ce2}$ between the collector and emitter of the second transistor 54. The attenuation network decreases the voltage at the load 28 by allowing current to flow through the second transistor 54. As the voltage level of the electrical signal increases, the second transistor 54 reaches saturation mode and the resistance $R_{ce2}$ decreases. As a result, because $R_{ce2}$ forms a divider network with the second resistor 58, the current flowing through the load 28 decreases, thereby limiting the relative voltage across the load 28. As the voltage level of the voltage source 24 increases further, the saturation level within the second transistor 54 deepens to further decrease the voltage across the load 28.

The signal circuit 50 operates in a non-limiting or linear range when the an electrical signal voltage level from the voltage source 24 is below the turn-on voltage for each transistor 52, 54, i.e., before the transistors 52, 54 are activated. In the non-limiting region, the relative voltage $V_{out}$ 34 across the load 28 is a linear function of the signal source or input $V_s$:

$$V_{out} = V_s \frac{R_{load}}{R_{load} + R_{adj}} = k * V_s = f(V_s)$$

This linear attenuation function in the non-limiting region is similar to that provided by the conventional signal circuit 64 having the passive adjusting resistor $R_{passive}$ 66 in the signal path described above with reference to FIG. 4. However, the signal circuit 50 operates in a limiting or non-linear range when the an electrical signal voltage level from the voltage source 24 is at or above the turn-on voltage for each transistor 52, 54, i.e., when the transistors 52, 54 are activated. In the non-linear limiting region, the relative voltage $V_{out}$ 34 across the load 28 is a non-linear function of the signal source or input $V_s$:

$$V_{out} = V_s \frac{R_{load} // R_{ecsat}}{R_{load} // R_{escat} + R_{adj}} = g(V_s)$$

The resistance $R_{cesat}$ between the collector and emitter of each transistor in saturation mode can be expressed as:

$$V_{cesat} = \frac{R_{cesat}}{I_C} = \frac{C_{cesat}}{h_{FE} * I_b} = \frac{V_{vesat}}{h_{FE} * (V_s / r_b)} = \frac{y(I_b)}{h_{FE} * (V_s / r_b)} = \frac{y(V_s / r_b)}{h_{FE} * (V_s / r_b)}$$

where $V_{cesat} = y(I_b) = y(V_s/r_b)$, $h_{FE} = I_c/I_b$ in saturation mode, and $r_b$ is the base-spreading resistance. Thus, transistors 52, 54 with minimized $R_{cesat}$ facilitates in achieving minimal attenuation in the linear, non-limiting region and maximum attenuation in the limiting region so as to provide better adjustment effect for the signal circuit 50. Merely as example, $R_{cesat}$ may be approximately 10 ohms while $R_{adj}$ may be approximately 10 to 20 ohms.

Figure 6:
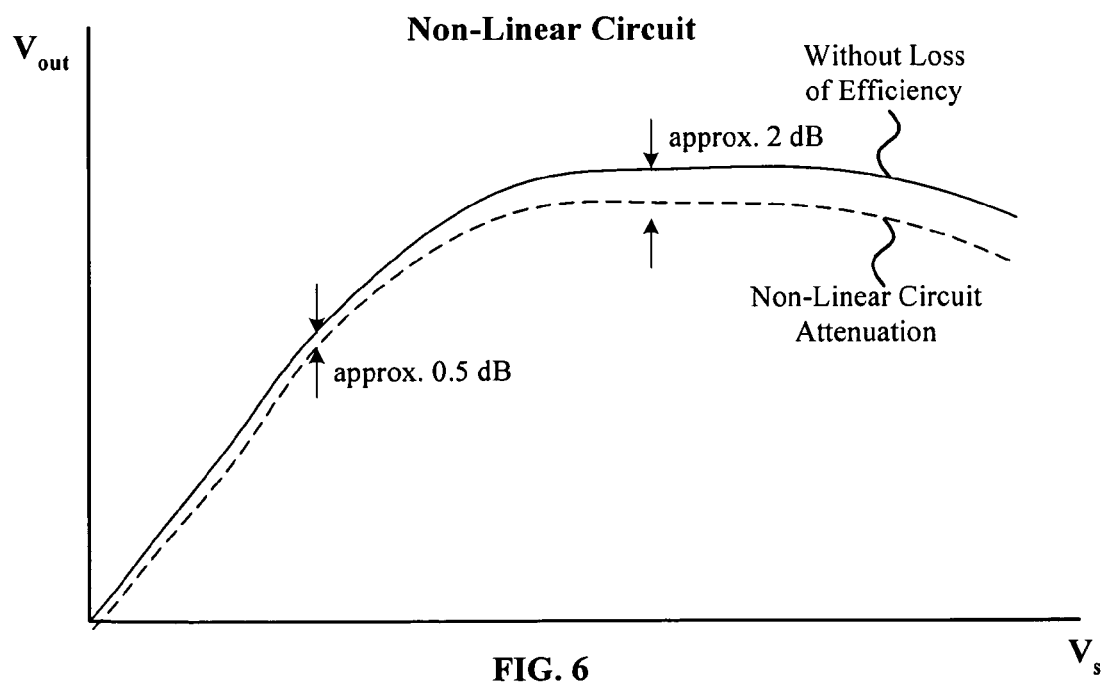
FIG. 6 is an exemplary graph illustrating the attenuation in signal level achieved by employing a non-linear signal circuit such as the circuit of FIG. 3.

FIG. 6 is a graph illustrating the attenuation in signal level achieved by employing a non-linear signal circuit such as the signal circuit 50 of FIG. 3. As shown in FIG. 6, $V_{out}$ in the limiting non-linear region is attenuated by approximately 2 dB while $V_{out}$ in non-limiting linear region is only attenuated by approximately 0.5 dB. As is evident, the signal circuit applies less attenuation in the non-limiting region while applying greater attenuation in the limiting region. It is noted that there are numerous other suitable configurations and methods for implementing the variable limiting circuit and that the exemplary circuit as shown in FIG. 3 is merely one example.

By providing an adjustment circuit such as the first and second resistors 56, 58 bridging between the output of the corresponding acoustic limiting component 60, 62 and the base of the corresponding transistor 52, 54, i.e., between the corresponding positive or negative terminals of $V_{out}$ and $V_s$, the limiting threshold and maximum output levels of the input-output characteristics of the signal circuit 50 can be modified and fine tuned to optimize acoustic characteristics while ensuring that safety requirement are met. Such characteristic allows the acoustic limiting components 60, 62 to work more effectively with different receivers such as different headset or earphone receivers to ensure both safety and minimal insertion loss.

Figure 7:
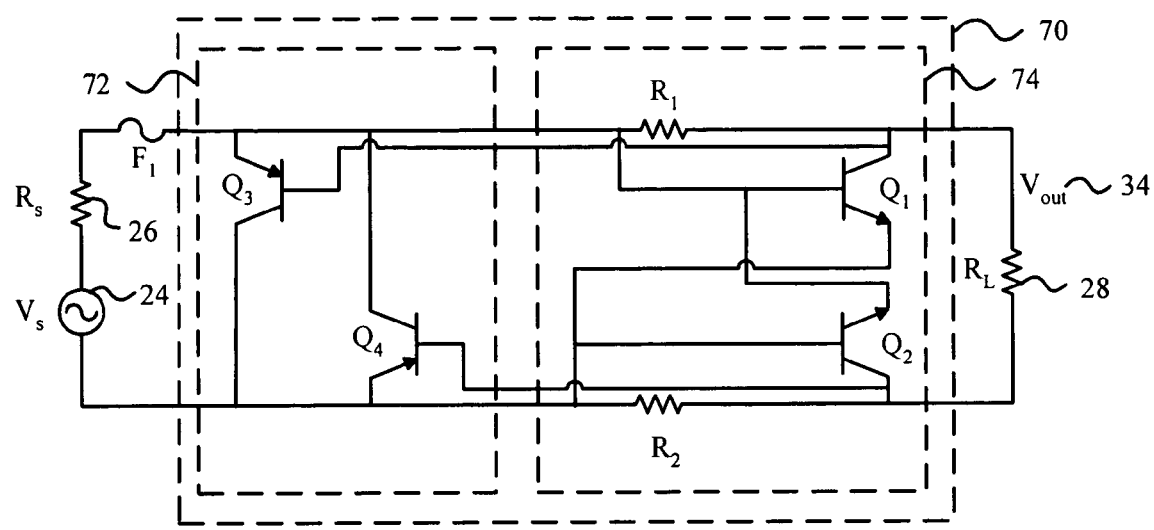
FIG. 7 is a circuit diagram of an exemplary acoustic limiting component for use in the signal circuit of FIG. 3.

As described above, the variably limiting signal circuit 50 includes one or more conventional or other acoustic limiting components for limiting output signal levels. FIG. 7 is a circuit diagram of an exemplary acoustic limiting component 70 for use in the signal circuit of FIG. 3. The exemplary acoustic limiting component 70 includes a signal level relay circuit 72 and a signal level attenuation circuit 74 coupled in parallel between a load $R_L$ 28 and a voltage source VS 24 with a corresponding source impedance $R_s$ 26. The signal level attenuation circuit 74 is activated by an electrical signal peak from the voltage source 24 being greater than a first threshold. The signal level relay circuit 72 is activated by an electrical signal peak from the voltage source 24 crossing a second threshold that is higher than the first threshold.

The acoustic signal level attenuation circuit 74 includes a first transistor $Q_1$, a second transistor $Q_2$, a first resistor $R_1$ and a second resistor $R_2$. The acoustic signal level attenuation circuit 74 is activated by the electrical signal from the voltage source 24 being sufficiently high to turn on the first and second transistors $Q_1$, $Q_2$. Typically, the transistor turn-on voltage is between approximately 0.5 and 0.7 volts. Once activated, the acoustic signal level attenuation circuit 74 attenuates the electrical signal or output voltage $V_{out}$ 34, i.e., the relative voltage across the load 28.

The signal level attenuation circuit 74 effectively attenuates the electrical signal as long as the electrical signal from the voltage source 24 does not put the first and second transistors $Q_1$, $Q_2$ into deep saturation modes. Deep saturation occurs when the electrical signal voltage level from the voltage source 24 is sufficiently high to drive the collector-emitter resistance $R_{ce}$ of the transistor to the minimum resistance level. At such deep saturation, the collector-emitter resistance $R_{ce}$ of the transistors $Q_1$, $Q_2$ remains generally constant as the electrical signal voltage level from the voltage source 24 increases. In deep saturation mode, the signal level attenuation circuit 74 operates as a resistor network such that the voltage across the load 34 increases with further increases in the voltage from the voltage source 24.

In order to attempt to prevent the signal level attenuation circuit 74 from going into deep saturation, the signal level relay circuit 72 is coupled in parallel to the signal level attenuation circuit 74 and the voltage source 24. The acoustic signal level relay circuit 72 includes a third and fourth transistors $Q_3$, $Q_4$. The acoustic signal level relay circuit 72 is activated when the voltage drops across the first and second resistors $R_1$, $R_2$ are sufficient to turn on the third and fourth transistors $Q_3$, $Q_4$, e.g., approximately 0.5 to 0.7 volts. Once activated, the signal level relay circuit 72 applies further attenuation to the electrical signal from the voltage source 24 by allowing current to flow through the transistors $Q_3$, $Q_4$. Thus the signal level relay circuit 72 provides additional protection and raises the voltage level of the voltage source 24 at which the signal level attenuation circuit 74 enters deep saturation mode. To protect a user from electrical signals of the voltage source 24 above this raised level, a fuse $F_1$ may be coupled to the voltage source 24. Additionally or alternatively, multiple layers of acoustic signal level relay circuits may be employed to provide additional protection, as described in co-pending U.S. patent application Ser. No. 09/967,677, entitled "Acoustic Signal Level Limiter for Hearing Safety" and filed on Sep. 28, 2001, the entirety of which is incorporated herein by reference.

Figure 1:
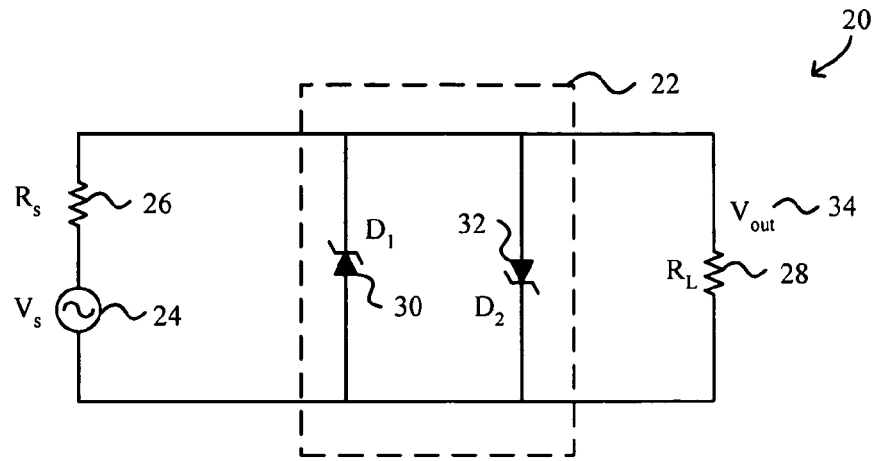
FIG. 1 is a circuit diagram of an exemplary signal circuit employing a conventional varistor circuit operable in various audio output devices to reduce acoustic signal output levels.
Figure 2:
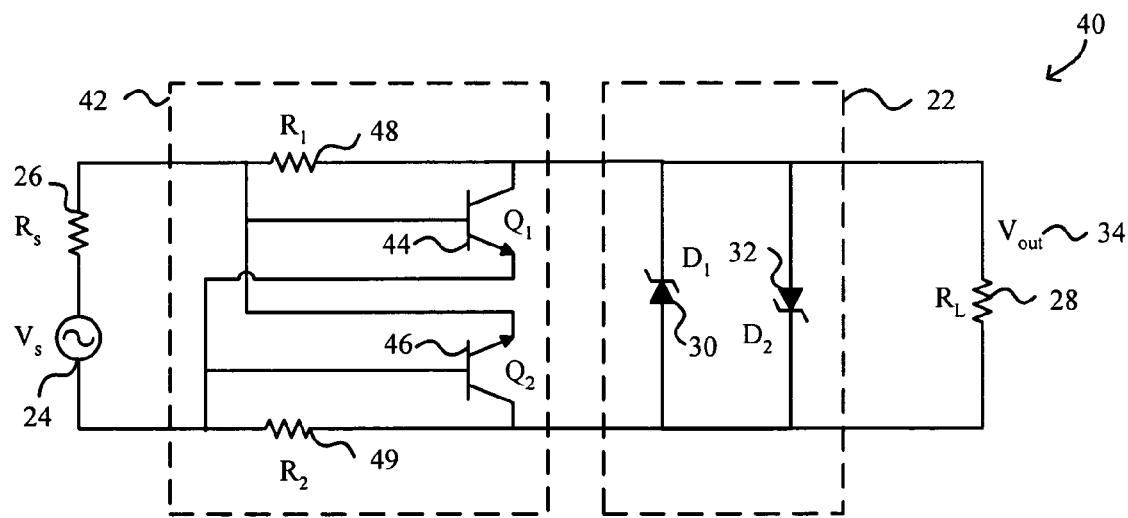
FIG. 2 is a circuit diagram of an exemplary signal circuit employing a discrete transistor/varistor circuit operable in various audio output devices to reduce acoustic signal output levels.

It is noted that in addition to the exemplary acoustic limiting component 70 shown in and described with reference to FIG. 7, various other acoustic limiting components may be employed in the variably limiting signal circuit 50. Merely as example, the varistor and/or the discrete transistor circuit as shown in and describe above with reference to FIGS. 1 and 2 may be alternatively or additionally employed.

Figure 8:
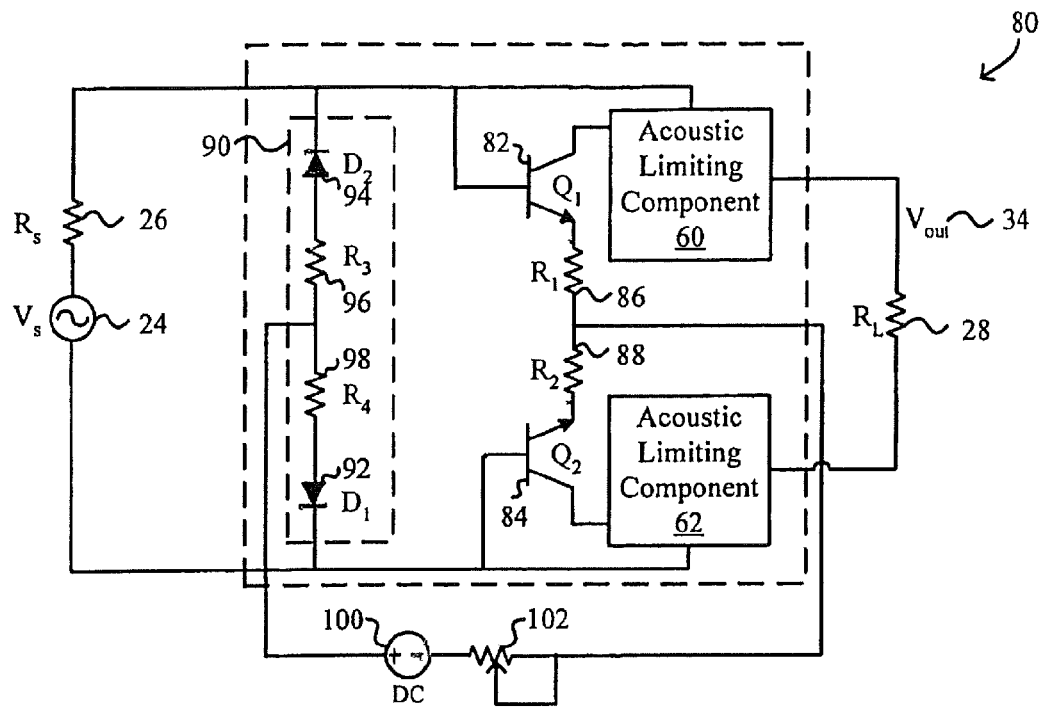
FIG. 8 is a circuit diagram of an exemplary signal circuit employing a manual and/or automatic shiftable limiting circuit operable to shiftably reduce acoustic signal output levels in various audio output devices.

Headsets are also becoming more commonly used for multiple applications, e.g., both speech application such as in traditional telephony and music listening application. Peak to average acoustic level ratios for music are greater than those for speech such that traditional diode limiting causes undesirable audible distortion for music listening applications. FIG. 8 is a circuit diagram of an exemplary shiftable signal circuit 80 employing a manual and/or automatic shiftable limiting circuit operable to shiftably reduce acoustic signal output levels in various audio output devices. In other words, the shiftable signal circuit 80 can vary the audio limiting level depending on the application for which the circuit 80 is being used, e.g., a higher audio limiting level for music applications and a lower audio limiting level for voice applications. The shiftable limiting feature can be applied in music listening to selectively shift the limiting level to a higher value and thereby achieve the greater signal dynamic range for music listening while still providing some level of signal limiting protection.

As shown, the shiftable signal circuit 80 includes a first transistor $Q_1$ 82, a second transistor $Q_2$ 84, as well as a first resistor 86 and a second resistor 88 coupled in series between the emitters of the transistors 82, 84. Each input of the first and second acoustic limiting components 60, 62 is coupled to the collector of the corresponding transistor 82, 84 and the outputs of the first and second acoustic limiting components 60, 62 are coupled across the load $R_L$ 28. The base and emitter of the first transistor 82 are coupled across the voltage source 24. The second transistor 84 is coupled in parallel to the voltage source 24 in a similar manner. In addition, a current steering circuit 90 including a first and second diode 92, 94 and a third and fourth resistor 96, 98 connected in series is coupled in parallel to the voltage source 24. Merely as an example, each of $R_1$, $R_2$, $R_3$ and $R_4$ may be approximately 10 ohms.

The shiftable signal circuit 80 utilizes a DC control signal to the acoustic limiting components 60, 62 to shift the limiting level depending on the application, e.g., voice or music listening. The DC control signal is provided by a DC voltage source 100 via a potentiometer or variable resistor 102.

In one embodiment, when the shiftable signal circuit 80 is in a voice application mode or otherwise in a mode where the limiting level is not to be raised or otherwise shifted, the DC control signal from the DC voltage source 100 set to 0.07 volts. In the (non-shifted) voice application mode, each transistor 82, 84 is activated and each diode 92, 94 is turned on by an electrical signal voltage level from the voltage source 24 being above the turn-on voltage of the first and second transistors 82, 84. Specifically, the first transistor 82 attenuates the positive portion of an electrical signal after the voltage level between the emitter and base of the first transistor 82 exceeds the turn-on voltage of the first transistor 82, e.g., approximately 0.5-0.7 volts. Once the first transistor 82 is turned on, an attenuation network is created that includes the resistance $R_{ce1}$ between the collector and emitter of the first transistor 82. The attenuation network decreases the positive voltage at the load 28 by allowing current to flow through the first transistor 82. The second transistor 84 operates in a similar manner as the first transistor 82 but on the negative portion of the electrical signal from the voltage source 24. As the voltage level of the electrical signal from the voltage source 24 increases, the first and second transistors 82, 84 reach saturation mode and the resistances $R_{ce1}$, $R_{ce2}$ decrease. As a result, because the resistances $R_{ce1}$, $R_{ce2}$ form a divider network with the load 28, the current flowing through the load 28 decreases, thus limiting the relative voltage across the load 28. As the voltage level of the voltage source 24 increases, the saturation level within the transistors 82, 84 deepens to decrease the voltage across the load 28.

In contrast, when the shiftable signal circuit 80 is in a music application mode or otherwise in a mode where the limiting level is to be raised or otherwise shifted, the DC control signal from the DC voltage source 100 is reduced to <0.7 volts (0 volts~0.7 volts) according to sensitivity of the transducer. In particular, in the music (shifted) mode, the limiting threshold is shifted up or increased from the normal limiting level for speech signals so as to achieve greater signal dynamic range yet still provide some degree of signal limiting protection. Each transistor 82, 84 is activated and each diode 92, 94 is turned on when the voltage level between the emitter and base of the corresponding transistor is above the transistor turn-on voltage, e.g., approximately 0.5-0.7 volts. By reducing the DC control signal from the DC voltage source 100, the required to turn on transistor 82, 84 is raised, thereby raising the electrical signal voltage level from the voltage source 24 at which the respectively transistor 82, 84 is activated. Once activated, the transistors 82, 84 perform similarly as in the voice application mode in which each transistor attenuates a corresponding positive or negative portion of the electrical signal from the voltage source 24. Once each transistor 82, 84 is turned on, an attenuation network is created that includes the resistance $R_{ce}$ between the collector and emitter of the corresponding transistor 82, 84. The attenuation network decreases the positive voltage at the load 28 by allowing current to flow through the first transistor 82. As the voltage level of the electrical signal from the voltage source 24 increases, the transistors 82, 84 reach saturation mode and their resistances $R_{ce1}$, $R_{ce2}$ decrease. As a result, because the resistances $R_{ce1}$, $R_{ce2}$ form a divider network with the load 28, the current flowing through the load 28 decreases, thus limiting the relative voltage across the load 28. As the voltage level of the voltage source 24 increases, the saturation level within the transistors 82, 84 deepens to decrease the voltage across the load 28.

Thus for telephony or speech applications, the DC control signal is set to 0.7 volts such that the signal circuit 80 provides a (lower) limiting level suitable for speech signals. For music applications, the DC control signal can be selected and/or adjusted to maintain the transistors 82, 84 inactivated until a desired larger signal level from the voltage source 24. In the music mode, until the desired larger signal level from the voltage source 24 is reached, the signal circuit 80 remains in linear mode. The particular signal level from the voltage source 24 at which the signal circuit 80 operates in non-linear or attenuation mode can be controlled by the level of the DC control signal from the DC voltage source 100. In other words, the DC level can be selected and/or adjusted via the potentiometer 102 based on the desire shifted limiting level of the voltage source 24. Furthermore, the polarity of the DC control signal may also be reversed from that shown in FIG. 8 to reverse-bias the transistors 82, 84, in order to achieve a high limiting level, i.e., shifting up to a level higher than that for the music mode. The DC control signal may also be set above 0.7 volts to pre-bias the transistor 82, 84 to further shift down the limiting level of speech mode.

The DC control signal level and/or polarity may be controlled manually by the user. Alternatively, the DC control signal level and/or polarity can be selected by design and/or automatically controlled by a microcontroller. For example, the microcontroller may determine that the headset is being used for voice or music listening applications based on a control input. In addition, the microcontroller may also determine the DC control signal level based on various inputs, for example. Merely as example, suitable DC control signal levels may be approximately 0.1 V to 1 V.

Although the shiftable signal circuit 80 is described herein as generally having two modes, speech and music, it is to be understood that the shiftable signal circuit 80 may be configured to operate in any suitable number of modes. The input signal level at which the shiftable signal circuit 80 operates in non-linear or cut-off region can be adjusted and selected by adjusting the level of the applied DC control voltage.

Figure 9:
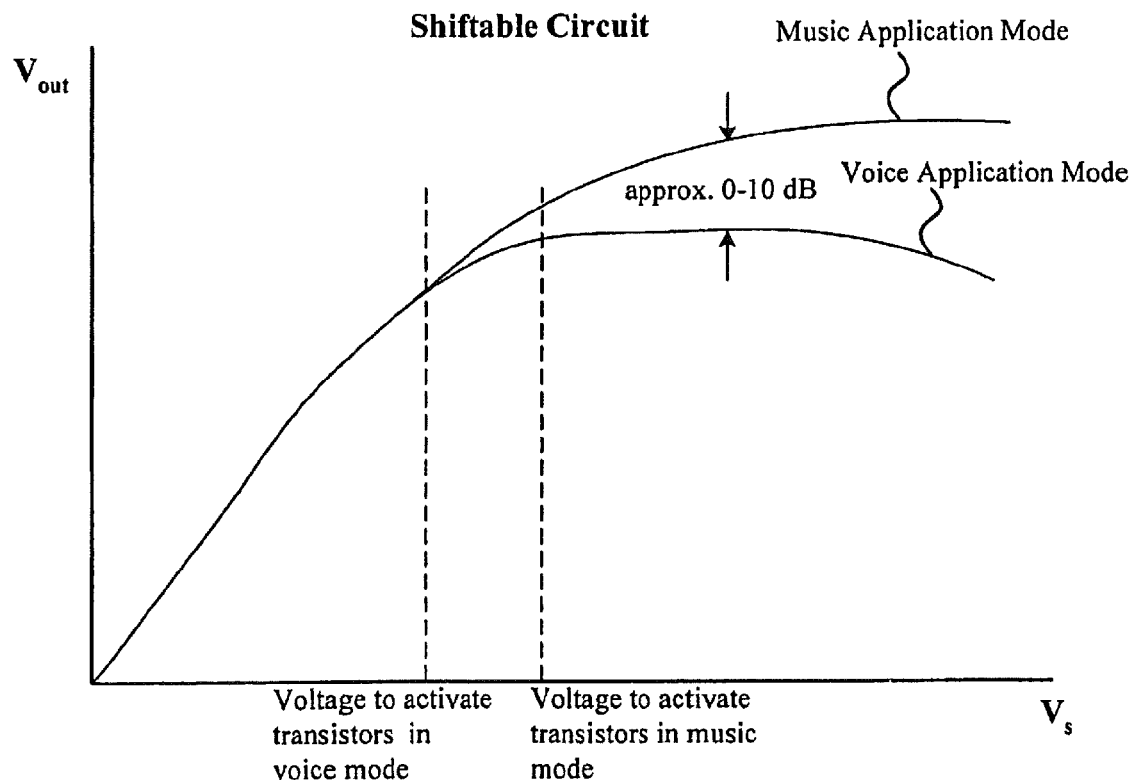
FIG. 9 is an exemplary graph illustrating the attenuation in signal level achieved by employing a shiftable acoustic signal output limiting circuit such as the circuit of FIG. 8.

FIG. 9 is an exemplary graph illustrating the attenuation in signal level achieved by employing a shiftable acoustic signal output limiting circuit such as the circuit of FIG. 8. As shown, when the shiftable acoustic signal output limiting circuit is in the voice mode, the signal circuit operates in linear mode until a first input signal level from the voltage source 24 is reached. In contrast, when the shiftable acoustic signal output limiting circuit is in the music mode, the signal circuit operates in linear mode until a second, greater input signal level from the voltage source 24 is reached.

The adjustable limiting and the shiftable limiting features as described herein can be employed individually or in combination. The adjustable limiting circuit facilitates in matching the overall limiting characteristics of the circuit to the different coupling efficiencies of various receivers. The adjustable limiting can be used to fine tune the limiting levels to work with different receivers to meet safety requirements. The shiftable limiting circuit facilitates in shifting the limiting level so as to adapt the circuit to different applications. The shiftable limiting can be applied in music listening to selectively shift the limiting level to a higher value than that for voice application, i.e., to achieve a larger signal dynamic range yet still provide a level of limiting protection.

While the exemplary embodiments of the present invention are described and illustrated herein, it will be appreciated that they are merely illustrative and that modifications can be made to these embodiments without departing from the spirit and scope of the invention. Thus, the scope of the invention is intended to be defined only in terms of the following claims as may be amended, with each claim being expressly incorporated into this Description of Specific Embodiments as an embodiment of the invention.

What is claimed is:

1. An apparatus, comprising:
   a signal level limiting apparatus having a signal level attenuation circuit configured to receive a source electrical signal from a signal source that activates an attenuation network of the signal level attenuation circuit to attenuate the source electrical signal to generate an output electrical signal at an output in response to a signal level of the source electrical signal crossing a threshold;
   a threshold shifting circuit configured to shift the signal level threshold of the source electrical signal for activating the signal level attenuation circuit, the threshold shifting circuit having a control voltage source coupled to the attenuation network via a resistive element for applying a voltage to the attenuation network;
   wherein the threshold shifting circuit further includes a current steering circuit coupled to the shift control voltage source and coupled in parallel to the signal source; and
   wherein the current steering circuit includes a first diode, a first resistor, a second resistor, and a second diode coupled in series and wherein one terminal of the shift control voltage source is coupled between the first and second resistors.

2. The apparatus of claim 1, wherein the threshold shifting circuit is configured to increase the signal level threshold when the signal level limiting apparatus is employed for music listening.

3. The apparatus of claim 1, wherein the threshold shifting circuit is configured to be inactive when the signal level limiting apparatus is employed for voice applications.

4. The apparatus of claim 1, wherein the control voltage source is a DC voltage source.

5. The apparatus of claim 1,
   wherein the signal level attenuation circuit includes a switch configured to receive the source electrical signal and to activate the attenuation network in response to the level of the source electrical signal crossing the threshold, the switching including:
  a first transistor configured to receive the source electrical signal and to detect a voltage on a positive portion of the source electrical signal, and
  a second transistor configured to receive the source electrical signal and detect a voltage on a negative portion of the source electrical signal; and
wherein the resistive element of the threshold shifting circuit includes a first resistor coupled to an emitter of the first transistor and a second resistor coupled between the first resistor and an emitter of the second transistor, one terminal of the shift control voltage source being coupled between the first and second resistors.

6. The apparatus of claim 5, wherein the resistive element of the threshold shifting circuit further includes a third threshold shifting resistor coupled between the control voltage source and the first and second threshold shifting resistors.

7. The apparatus of claim 6, wherein the third threshold shifting resistor has an adjustable resistance.

8. The apparatus of claim 5, wherein each transistor is activated when a voltage between a base and an emitter of the corresponding transistor is above a turn-on voltage of the transistor, and wherein the shift control voltage source is configured to modify a voltage at the emitter of each transistor so as to shift the signal level threshold of the source electrical signal at which the signal level attenuation circuit is activated.

9. A signal level limiting method, comprising:
  activating an attenuation network of a signal level attenuation circuit to attenuate the source electrical signal and to generate an output electrical signal at an output in response to a signal level of the source electrical signal crossing a threshold;
  applying a control signal from a control signal source to the attenuation network to shift the signal level threshold of the source electrical signal for activating the attenuation network;
  wherein the shifting includes steering a current through a current steering circuit coupled to the shift control signal source; and
  wherein the current steering circuit includes a first diode, a first resistor, a second resistor, and a second diode coupled in series and wherein one terminal of the shift control voltage source is coupled between the first and second resistors.

* * * * *

UNITED STATES PATENT AND TRADEMARK OFFICE
CERTIFICATE OF CORRECTION

PATENT NO. : 7,616,769 B1  Page 1 of 1
APPLICATION NO. : 10/952662
DATED : November 10, 2009
INVENTOR(S) : Shyu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1405 days.

Signed and Sealed this

Nineteenth Day of October, 2010

David J. Kappos
*Director of the United States Patent and Trademark Office*